(12) United States Patent
Deguenther et al.

(10) Patent No.: US 10,012,907 B2
(45) Date of Patent: Jul. 3, 2018

(54) OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventors: Markus Deguenther, Aalen (DE); Thomas Korb, Schwaebisch Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/370,761

(22) Filed: Dec. 6, 2016

(65) Prior Publication Data

US 2017/0082928 A1 Mar. 23, 2017

Related U.S. Application Data

(63) Continuation of application No. PCT/EP2015/061364, filed on May 22, 2015.

(30) Foreign Application Priority Data

Jun. 6, 2014 (DE) .................. 10 2014 210 927
Aug. 12, 2014 (DE) .................. 10 2014 215 970

(51) Int. Cl.
*G02B 27/10* (2006.01)
*G03B 27/54* (2006.01)
(Continued)

(52) U.S. Cl.
CPC ..... *G03F 7/70075* (2013.01); *G02B 19/0047* (2013.01); *G02B 19/0095* (2013.01);
(Continued)

(58) Field of Classification Search
CPC ............ G02B 19/0047; G02B 19/0095; G02B 27/0905; G02B 27/0944; G02B 27/0961;
(Continued)

(56) References Cited

U.S. PATENT DOCUMENTS 6,069,739 A 5/2000 Borodovsky et al.
6,583,937 B1 6/2003 Wangler et al.
(Continued)

FOREIGN PATENT DOCUMENTS

DE 2803277 A1 8/1979
DE 19856575 A1 9/2000
(Continued)

OTHER PUBLICATIONS

International Preliminary Report on Patentability and Written Opinion in counterpart International Application No. PCT/EP2015/061364, dated Dec. 6, 2016, 22 pages; along with English Translation.

(Continued)

*Primary Examiner* — Colin Kreutzer
(74) *Attorney, Agent, or Firm* — Edell, Shapiro & Finnan, LLC

(57) ABSTRACT

An optical system of a microlithographic projection exposure apparatus designed for an operating wavelength of at least 150 nm. In one disclosed aspect, the optical system includes an element (11, 21) producing an angular distribution for light incident during the operation of the optical system and a fly's eye condenser (200, 400, 500) which includes two arrangements (210, 220, 410, 420, 510, 520) following one another in the light propagation direction and made of beam-deflecting optical elements (211-213, 221-223, 411-413, 421-423, 511-513, 521-523), which produce a multiplicity of optical channels. No optical element with refractive power is arranged in the beam path between the (Continued)

element (11, 21) producing an angular distribution and the fly's eye condenser (200, 400, 500).

15 Claims, 6 Drawing Sheets

(51) Int. Cl.
G03B 27/72 (2006.01)
G03F 7/20 (2006.01)
G02B 27/09 (2006.01)
G02B 19/00 (2006.01)

(52) U.S. Cl.
CPC ..... *G02B 27/0905* (2013.01); *G02B 27/0944* (2013.01); *G02B 27/0961* (2013.01); *G03F 7/2006* (2013.01); *G03F 7/2008* (2013.01); *G03F 7/70025* (2013.01); *G03F 7/70108* (2013.01); *G03F 7/70116* (2013.01); *G03F 7/70241* (2013.01)

(58) Field of Classification Search
CPC .. G03F 7/2006; G03F 7/2008; G03F 7/70025; G03F 7/70075; G03F 7/70108; G03F 7/70116; G03F 7/70241
USPC .............................. 355/67, 71; 359/619–622
See application file for complete search history.

(56) References Cited

U.S. PATENT DOCUMENTS

| 8,081,386 | B2 | 12/2011 | Hauschild et al. |
| 8,520,307 | B2 | 8/2013 | Wolf et al. |
| 2001/0052969 | A1 | 12/2001 | Bunau et al. |
| 2003/0086524 | A1 | 5/2003 | Schultz et al. |
| 2004/0156130 | A1* | 8/2004 | Powell ............. G02B 3/0025 359/845 |
| 2005/0248849 | A1 | 11/2005 | Urey et al. |
| 2008/0165415 | A1 | 7/2008 | Chan et al. |
| 2008/0225256 | A1* | 9/2008 | Kita ................. G02B 27/0927 355/67 |
| 2009/0021716 | A1* | 1/2009 | Wangler ........... G03F 7/70075 355/67 |
| 2014/0176930 | A1 | 6/2014 | Deguenther et al. |
| 2014/0347721 | A1 | 11/2014 | Bittner et al. |

FOREIGN PATENT DOCUMENTS

| DE | 102006042452 A1 | 8/2007 |
| DE | 102009032939 A1 | 1/2011 |
| EP | 2073061 A2 | 6/2009 |
| WO | 2011006710 A2 | 1/2011 |

OTHER PUBLICATIONS

Office Action in corresponding German Application 102014210927. 2, dated Jan. 28, 2015, along with English Translation.

International Search Report and Written Opinion in counterpart International Application No. PCT/EP2015/061364, dated Sep. 25, 2015.

* cited by examiner

OPTICAL SYSTEM OF A MICROLITHOGRAPHIC PROJECTION EXPOSURE APPARATUS

CROSS REFERENCE TO RELATED APPLICATIONS

This is a Continuation of International Application PCT/EP2015/061364, which has an international filing date of May 22, 2015, and the disclosure of which is incorporated in its entirety into the present Continuation by reference. The following disclosure is also based on and claims the benefit of and priority under 35 U.S.C. § 119(a) to German Patent Application Nos. DE 10 2014 210 927.2, filed Jun. 6, 2014, and DE 10 2014 215 970.9, filed Aug. 12, 2014, which are also incorporated in their respective entireties into the present Continuation by reference.

FIELD OF THE INVENTION

The invention relates to an optical system of a microlithographic projection exposure apparatus.

BACKGROUND

Microlithographic exposure apparatuses are used for producing microstructured components, such as integrated circuits or LCDs, for example. Such a projection exposure apparatus comprises an illumination device and a projection lens. In the microlithography process, the image of a mask (reticle) illuminated by the illumination device is projected with the aid of the projection lens onto a substrate (for example a silicon wafer) coated with a light-sensitive layer (photoresist) and arranged in the image plane of the projection lens, in order to transfer the mask structure to the light-sensitive layer.

The use of so-called fly's eye condensers for obtaining light mixing is conventional in the illumination device, said fly's eye condensers comprising grid arrangements made of a multiplicity of beam-deflecting elements (e.g. lens elements with dimensions in the millimeter range) for producing a multiplicity of optical channels. In principle, such a fly's eye condenser may be used both for field homogenization and pupil homogenization. Beyond the homogenization of the laser light, a further important object of the fly's eye condenser lies in stabilization in this case, meaning that the position of the illumination in a specific plane of the illumination device remains unchanged in relation to variations of location and, in particular, direction of the beams emanating from the laser light source.

In principle, it is desirable to minimize the number of employed optical elements (e.g. refractive lens elements in an illumination device configured for operation in the VUV range or in the case of an operating wavelength of more than 150 nm) during the operation of a microlithographic projection exposure apparatus.

However, in a conventional typical design of an illumination device equipped with a fly's eye condenser, as depicted schematically in FIG. 6, a beam path is realized which is collimated to the extent that the chief rays passing centrally through the respective optical channels (each of which, in accordance with FIG. 6, being formed by respectively one beam-deflecting optical element 611, 612, 613—also referred to as "field honeycomb" below—of a first beam-deflecting arrangement 610 and one beam-deflecting optical element 621, 622, 623—also referred to as "pupil honeycomb" below—of a second beam-deflecting arrangement 620) extend parallel to the optical system axis OA upon entry into the fly's eye condenser 600. A consequence of this in turn is that the virtual intermediate images produced by the beam-deflecting optical elements or "pupil honeycombs" 621, 622, 623 of the second beam-deflecting arrangement 620 lie—as indicated in FIG. 6 by dashed arrows—at "negative infinity" in relation to the light propagation direction. As likewise indicated in FIG. 6, the beam-deflecting optical elements or "field honeycombs" 611, 612, 613 of the first beam-deflecting arrangement 610 focus the illumination light into the optical channels in each case, with the images of the field honeycombs accordingly being recorded by an optical unit 614 from the intermediate image lying at "negative infinity" in relation to the light propagation direction and being imaged on a target surface 615, which is situated in the rear focal plane of the optical unit 614 and which may be e.g. a field plane of a reticle masking system (REMA).

The beam path described above on the basis of FIG. 6, which is collimated in the region of the fly's eye condenser 600 and in which there is a light entry perpendicular to the plane of the fly's eye condenser 600 or the first beam-deflecting arrangement 610 thereof, is selected, in particular, in order to prevent unwanted field dependencies of the intensity (in particular unwanted intensity variations of the illumination pupil over the field or variation of the illumination poles of a specific illumination setting, such as e.g. a dipole setting, on the reticle plane) which otherwise occur in the microlithographic imaging process and which are caused by the imaging properties of the beam-deflecting optical elements of the fly's eye condenser. Typically, optical systems such as, for example, a zoom-axicon system, are used in the illumination device for realizing this beam path which is collimated in the region of the fly's eye condenser 600, but this is accompanied by a transmission loss and therefore a reduction or impairment of the throughput of the projection exposure apparatus. Moreover, the beam path which is collimated in the region of the fly's eye condenser 600 is selected with the light entry perpendicular to the plane of the fly's eye condenser 600 or the first beam-deflecting arrangement 610 thereof in order to minimize a change in the system transmission as a consequence of variations in the direction of the beams emanating from the laser light source (also referred to as "pointing") in conjunction with the finite angle divergence of the beams incident on the beam-deflecting optical elements or "field honeycombs" 611, 612, 613 of the fly's eye condenser 600.

In respect of the prior art, reference is made merely by way of example to U.S. Pat. No. 8,520,307 B2 and WO 2011/006710 A2.

SUMMARY

It is an object of the present invention to provide an optical system of a microlithographic projection exposure apparatus which at least largely avoids the disadvantages explained above and, in particular, facilitates a homogenization and stabilization of the laser light, in particular also with comparatively little structural outlay or a simple design, and with as little light loss as possible.

This object is achieved by the features of the independent patent claims.

An optical system of a microlithographic projection exposure apparatus designed for an operating wavelength of at least 150 nm comprises:

an element producing an angular distribution for light incident during the operation of the optical system; and a fly's eye condenser which comprises two arrangements following one another in the light propagation direction and made of beam-deflecting optical elements for producing a multiplicity of optical channels;

wherein no optical element with refractive power is arranged in the beam path between the element producing an angular distribution and the fly's eye condenser.

In particular, the present invention is based on the concept of avoiding, to the greatest possible extent, a light loss or an intensity attenuation during operation of the optical system by dispensing with the use of refractive-power-exhibiting optical elements in the beam path between an element (e.g. a diffractive optical element or a micromirror arrangement), situated upstream of the fly's eye condenser in the light propagation direction and producing an angular distribution for incident light, and the fly's eye condenser itself and, in contrast to the conventional design described above on the basis of FIG. 6, accepting a divergent illumination of the fly's eye condenser (i.e. finite beam angles) between the chief rays, which are generated by the fly's eye condenser and pass centrally through the respective optical channels, and the optical system axis in the process.

This concept is based on the idea that a superposition of the images of all field honeycombs of the fly's eye condenser may be realized, even in the case of such a divergent illumination of the fly's eye condenser, by way of a suitable configuration of the field or pupil honeycombs of the fly's eye condenser (in particular in respect of the respective "pitch", i.e. the period lengths or grid dimension of the field or pupil honeycomb arrangements of the fly's eye condenser), as will be described in more detail below. Here, according to the invention, a more complex design of the fly's eye condenser is deliberately accepted in order, in return, to reduce the structure of the optical system in relation to the light propagation direction upstream of the fly's eye condenser and a light loss occurring in this region.

In accordance with one embodiment, the fly's eye condenser is arranged in such a way that, for at least some of the optical channels, the rays (referred to as "chief rays" below) in each case passing centrally through the beam-deflecting optical elements of the relevant optical channel during operation of the optical system are divergent.

In accordance with a further aspect, the invention also relates to an optical system of a microlithographic projection exposure apparatus designed for an operating wavelength of at least 150 nm, comprising:

an element producing an angular distribution for light incident during the operation of the optical system; and
a fly's eye condenser which comprises two arrangements following one another in the light propagation direction and made of beam-deflecting optical elements for producing a multiplicity of optical channels;
wherein the fly's eye condenser is arranged in such a way that, for at least some of the optical channels, the chief rays in each case passing centrally through the beam-deflecting optical elements of the relevant optical channel during operation of the optical system are divergent.

In accordance with one embodiment, the optical system has an optical system axis, the fly's eye condenser being arranged in such a way that the maximum angle from the optical system axis is at least 5 mrad, in particular at least 10 mrad, more particularly at least 20 mrad, for the chief rays in each case passing centrally through the beam-deflecting optical elements during operation of the optical system.

In accordance with one embodiment, the two arrangements made of beam-deflecting optical elements following one another in the light propagation direction differ from one another in terms of their period length ("pitch").

In accordance with one embodiment, at least some, in particular all, of the beam-deflecting optical elements in both arrangements made of beam-deflecting optical elements are arranged in such a way that the chief rays in each case passing centrally through the respective beam-deflecting optical elements of the relevant optical channel during operation of the optical system are incident perpendicularly onto the relevant beam-deflecting optical element.

In accordance with one embodiment, at least some, in particular all, of the beam-deflecting optical elements in both arrangements made of beam-deflecting optical elements are arranged tangentially on at least one circular segment.

In accordance with one embodiment, at least some, in particular all, of the beam-deflecting optical elements in both arrangements are arranged in such a way that, for at least one of the two arrangements, the respective center points of the beam-deflecting optical elements lie in a common plane extending perpendicular to the optical system axis.

In accordance with one embodiment, the element producing an angular distribution is a mirror arrangement with a plurality of mirror elements that are adjustable independently of one another.

In accordance with one embodiment, the element producing an angular distribution is a diffractive optical element (DOE).

In principle, the beam-deflecting elements may be configured as refractive or diffractive optical elements and produced e.g. from fused silica ($SiO_2$) or calcium fluoride ($CaF_2$), with the production from calcium fluoride being advantageous, in particular in view of the improved light resistance (avoidance of compaction effects, etc.). By way of example, corresponding refractive lens elements for forming the beam-deflecting elements may be biconvex lenses, plano-convex lenses, cylindrical lenses, etc.

In accordance with a further configuration, individual ones, or all, of the beam-deflecting elements may also be embodied as reflective elements (mirrors)

In accordance with one embodiment, the fly's eye condenser is arranged at least in the direct vicinity of a pupil plane. In such a position, the fly's eye condenser may be used for spanning the field (i.e., as a so-called FDE, i.e. as a "field-defining element"). As described in e.g. US 2008/0165415 A1, the vicinity to the pupil may be described quantitatively by way of the parameter P(M), which is defined as $$P(M) = \frac{D(SA)}{D(SA) + D(CR)}, \quad (1)$$

where D(SA) denotes the subaperture diameter and D(CR) denotes the maximum chief ray distance (from all field points or defined over all field points of the optically used field) on the optical surface M in the relevant plane. The subaperture diameter is given by the maximum diameter of a portion of the optical element illuminated by the rays of a beam emanating from a given field point. As a result, P(M)=0 applies to an element situated in a field plane (having a subaperture diameter of 0) and P(M)=1 applies to an element situated in a pupil plane (having a chief ray distance of 0). The aforementioned fly's eye condenser is preferably situated in a plane in which the parameter P(M) is at least 0.8, in particular at least 0.9.

In accordance with further aspects, the invention also relates to an illumination device, a microlithographic projection exposure apparatus and a method for microlithographic production of microstructured components.

Further configurations of the invention can be gathered from the description and the dependent claims.

The invention is explained in greater detail below on the basis of exemplary embodiments illustrated in the accompanying figures.

DETAILED DESCRIPTION

Figure 1:
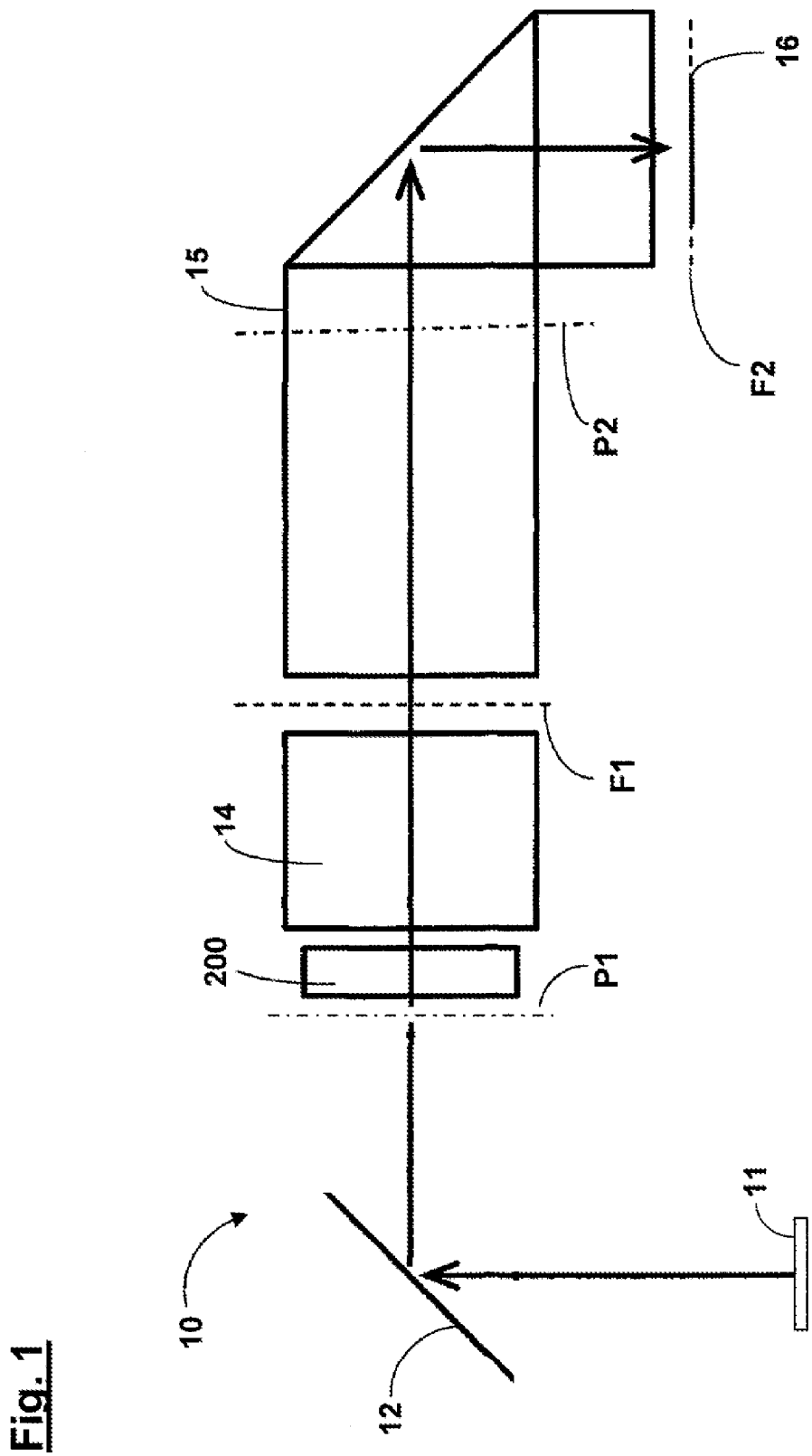
FIG. 1 shows a schematic illustration of an exemplary design of an illumination device of a microlithographic projection exposure apparatus in accordance with one embodiment of the present invention.

FIG. 1 shows, merely in a schematic illustration, the basic design of an illumination device of a microlithographic projection exposure apparatus in accordance with one embodiment of the invention.

The illumination device 10 serves to illuminate a structure-carrying mask (reticle) 16 with light from a light-source unit (not depicted here), which e.g. comprises an ArF laser for an operating wavelength of 193 nm and a beam shaping optical unit producing a parallel light beam. Alternatively, the light-source unit may also be embodied as, for example, an $F_2$ laser for an operating wavelength of 157 nm.

In accordance with the exemplary embodiment, the parallel light beam from the light-source unit is initially incident on an element 11 producing an angular distribution which, in the exemplary embodiment of FIG. 1, is configured as a diffractive optical element (DOE), also denoted as a 'pupil defining element', and which produces a desired intensity distribution (e.g. dipole distribution or quadrupole distribution) in a pupil plane P1 by way of an angular emission characteristic defined by the respective diffractive surface structure. Optionally and for the purposes of folding the optical beam path (without, however, the invention being restricted hereto), a deflection mirror 12, in accordance with FIG. 1, is situated downstream, in the light propagation direction, of the element 11 producing an angular distribution or the DOE.

A fly's eye condenser 200 according to the invention, the design and arrangement of which will be described in more detail below with reference to FIG. 2ff, is situated in the direct vicinity of the first pupil plane P1 of the illumination device 10. As can be seen from FIG. 1, only the deflection mirror 12 is situated between the element 11 producing an angular distribution, or DOE, and the fly's eye condenser 200. As such, in particular, no element with refractive power is present in this region between the element 11 producing an angular distribution, or DOE, and the fly's eye condenser 200. Since optical elements which ensure a collimated beam path in the region of the fly's eye condenser 200 through refractive power are thus dispensed with, the light is incident in divergent fashion on the fly's eye condenser 200 during operation of the illumination device 10, as described in more detail below with reference to FIG. 2ff.

Following the fly's eye condenser 200 in the light propagation direction there is a lens group 14, behind which a field plane F1 with a reticle masking system (REMA) is situated. The REMA image is imaged by a subsequent REMA lens 15 in the light propagation direction, a second pupil plane P2 being situated in said REMA lens, onto the structure-carrying mask (reticle) 16 arranged in the field plane F2, and, as a consequence, restricting the illuminated region on the reticle 16. Using a projection lens (not depicted here), the structure-carrying mask 16 is imaged onto a substrate provided with a light-sensitive layer or onto a wafer.

In the illumination device 10 described above with reference to FIG. 1, the fly's eye condenser 200 serves to homogenize the field, with the light distribution in the pupil plane P1 initially being produced by the diffractive optical element (element 11). The light distribution is then converted into the light distribution in the field plane F1 or F2 with the fly's eye condenser 200.

Figure 3:
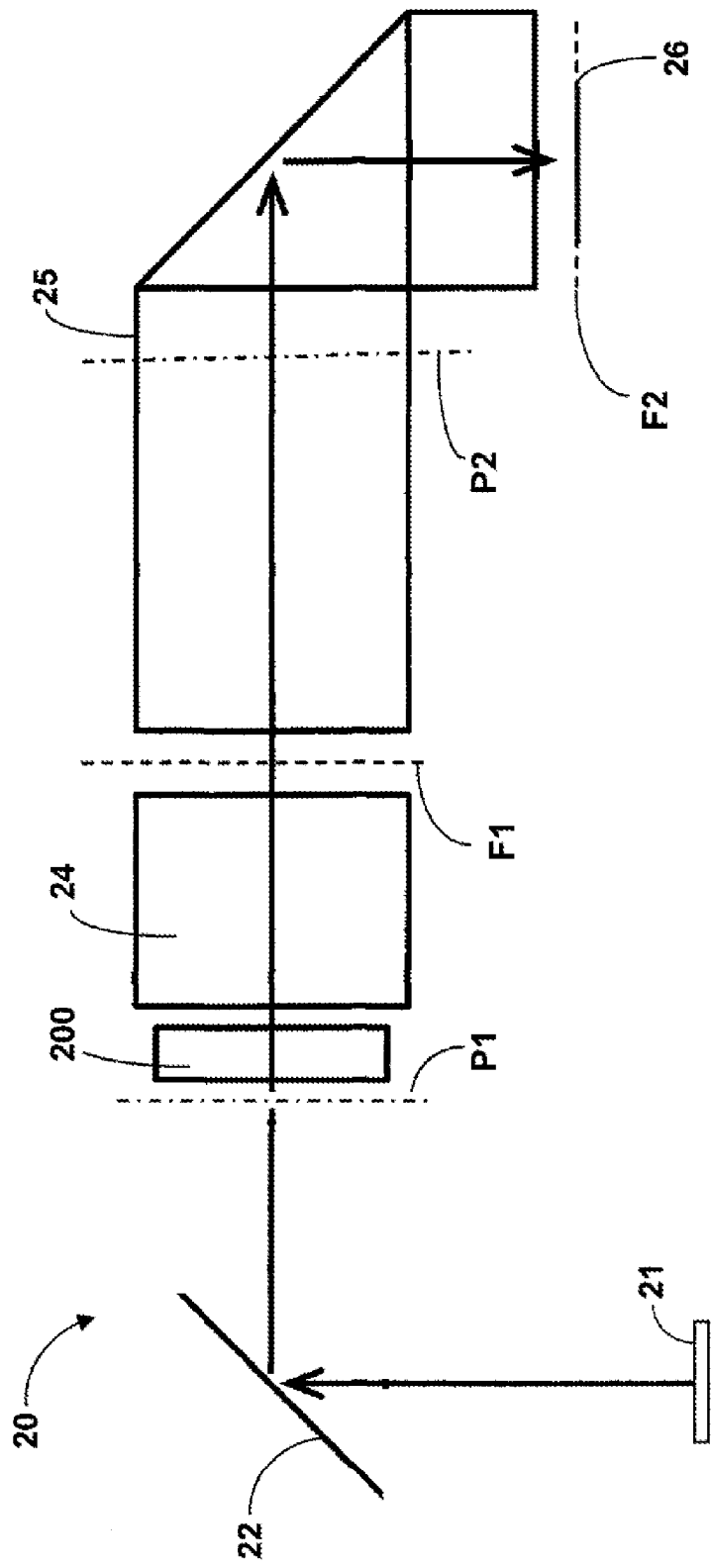
FIG. 3 shows a schematic illustration of an exemplary design of an illumination device of a microlithographic projection exposure apparatus in accordance with a further embodiment of the present invention.

In accordance with a further embodiment, it is possible, as depicted in FIG. 3, for an element 21 producing an angular distribution also to be configured as a mirror arrangement with a plurality of mirror elements or micromirrors which are adjustable independently of one another. In relation to the light propagation direction, a further optical unit bringing about the suitable illumination of the mirror arrangement is situated upstream of this mirror arrangement. Incidentally, in FIG. 3, components analogous or substantially functionally identical to those of FIG. 1 are denoted by reference numerals increased by "10".

Figure 2:
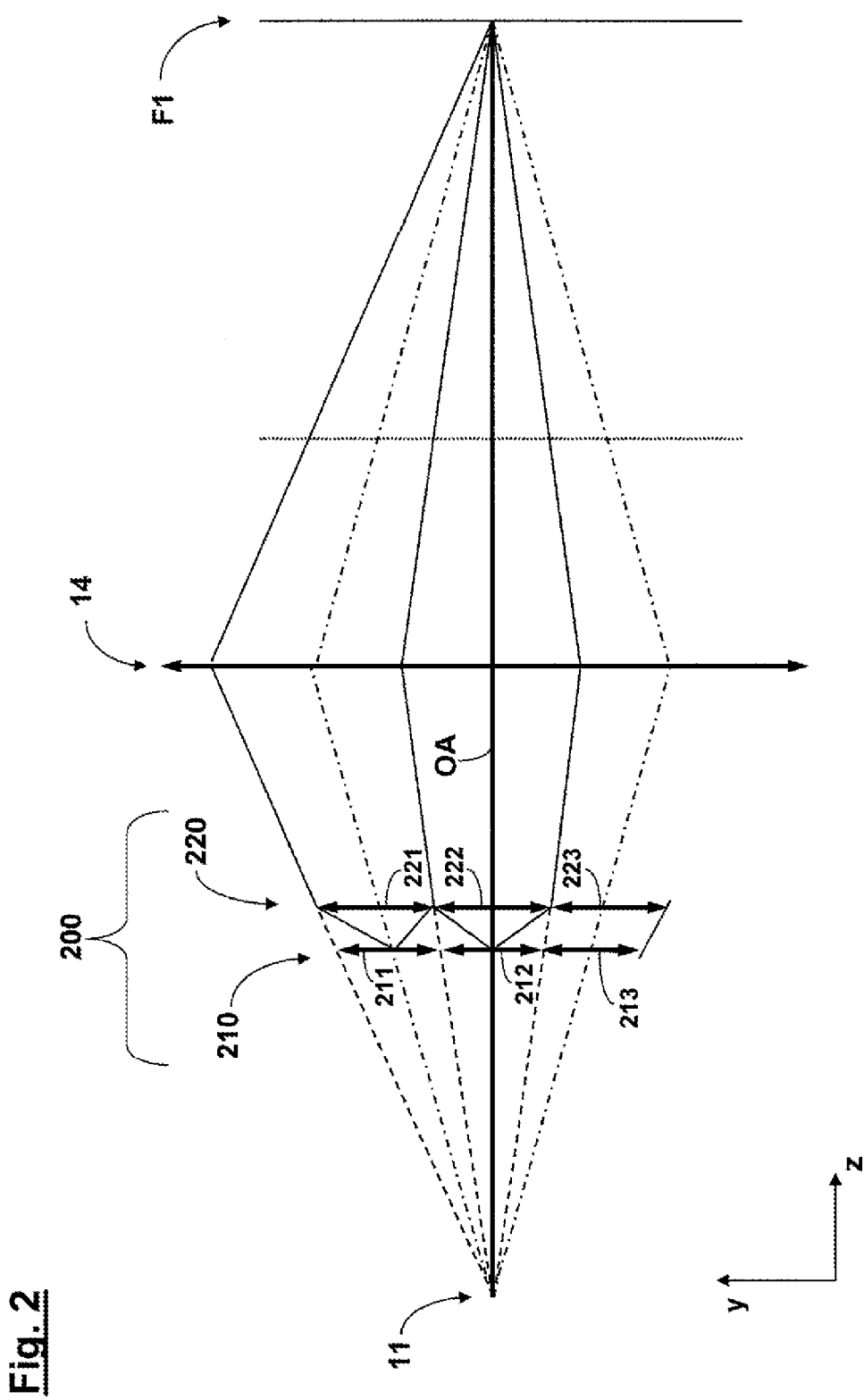
FIG. 2 shows a schematic illustration for explaining the arrangement according to the invention of a fly's eye condenser in an illumination device in accordance with one embodiment.

FIG. 2 schematically illustrates a fly's eye condenser 200 according to the invention in accordance with a first embodiment. The fly's eye condenser 200 has two arrangements 210, 220 which are situated behind one another in the light propagation direction (corresponding to the z-direction in the plotted coordinate system) and which each have a multiplicity of beam-deflecting elements, of which, for simplification purposes, only three beam-deflecting elements ("field honeycombs") 211, 212, 213 of the first arrangement 210 and three beam-deflecting elements ("pupil honeycombs") 221, 222, 223 of the second arrangement 220 are depicted in each case. By way of example, these beam-deflecting elements 211, 212, 213 and 221, 222, 223 may be configured as refractive biconvex lenses (e.g. made of calcium fluoride, $CaF_2$) in each case and stringed together in each case without gaps in each arrangement. The number of beam-deflecting optical elements per arrangement 210, 220 is typically substantially greater than in the simplified illustration of FIG. 2. A merely exemplary, typical number may be approximately 40*40 beam-deflecting optical elements per arrangement, wherein typical dimensions (without the invention being restricted hereto) may lie in the millimeter range, e.g. from 0.5 mm to 4 mm.

The beam-deflecting elements ("field honeycombs") 211, 212, 213 of the first arrangement 210 ensure that the same amount of light is always incident on the respectively assigned beam-deflecting element ("pupil honeycomb") 221, 222, 223 of the second arrangement 220, even in the case of an oblique illumination of the fly's eye condenser 200 in relation to the optical system axis OA. The effect of the beam-deflecting elements ("pupil honeycombs") 221, 222, 223 of the second arrangement 220 is that the latter, together with the optical unit 14 disposed downstream thereof, images the relevant beam-deflecting element ("field honeycomb") 211, 212, 213 of the first arrangement 210 onto the field plane.

Exactly one ray (plotted in a dash-dotted manner in FIG. 2) is assigned to each one of the optical channels, said ray passing through both the center of the respective field honeycomb 211, 212, 213 and the center of the respective pupil honeycomb 221, 222, 223. Here, and below, this ray is referred to as chief ray. In accordance with FIG. 2, the chief rays of the optical channels extend divergently prior to entry into the fly's eye condenser 200, i.e. they include a finite angle with the optical system axis OA (wherein this angle may, in particular, increase with increasing distance of the respective optical channel from the optical system axis OA). Here, the maximum angle with the optical system axis may be at least 5 mrad, in particular at least 10 mrad, more particularly at least 20 mrad, for all of the optical channels or the chief rays as defined above.

Figure 6:
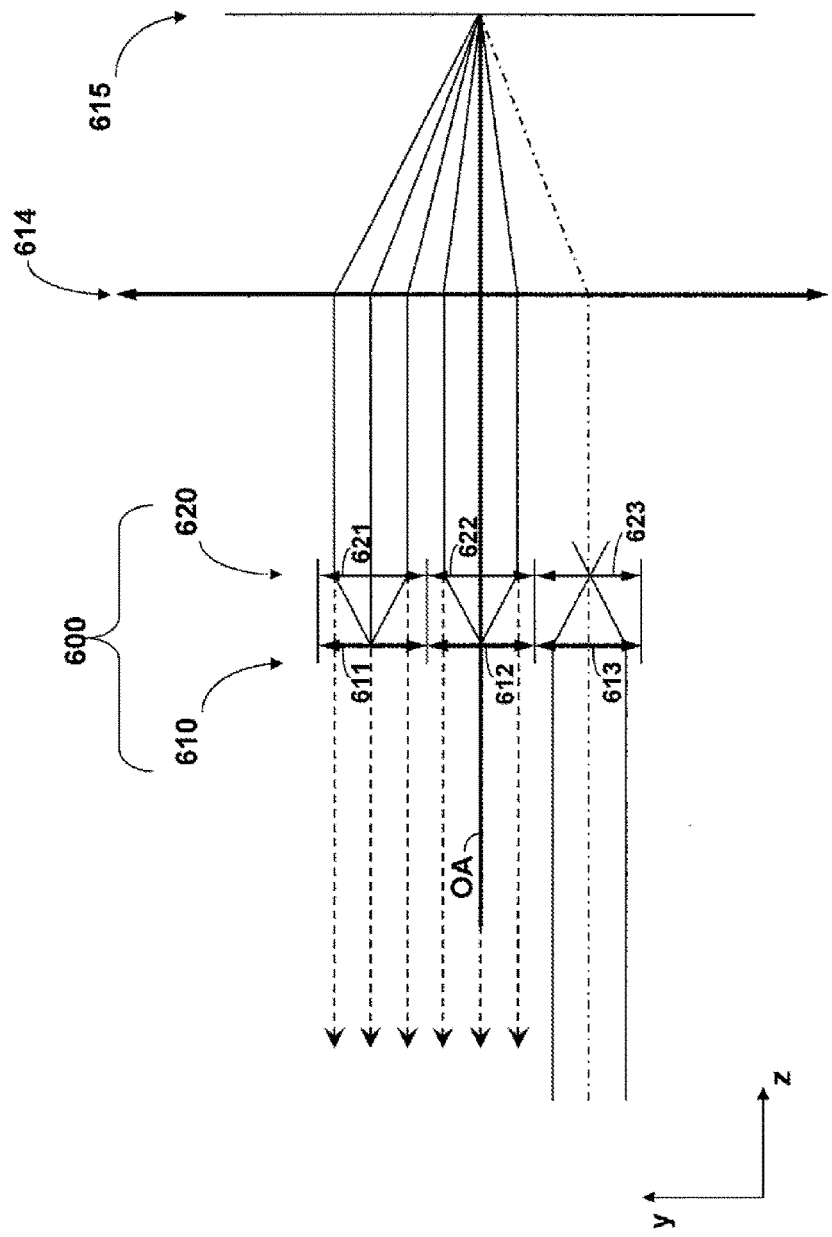
FIG. 6 shows a schematic illustration for explaining a conventional arrangement of a fly's eye condenser in an illumination device.

As indicated in FIG. 2, the beam-deflecting optical elements or "field honeycombs" 211, 212, 213 of the first beam-deflecting arrangement 210 focus the illumination light into the optical channels in each case, with the images of the field honeycombs 211, 212, 213 accordingly being recorded by an optical unit 14 from the intermediate image now lying at a (negative) finite value in relation to the light propagation direction and being imaged on a target surface, which may be e.g. a field plane F1 of a reticle masking system (REMA). As can likewise be seen in FIG. 2 and in contrast to the conventional arrangement of FIG. 6, this target surface is no longer situated in the rear focal plane of the optical unit 14 in this case, but instead downstream of the rear focal plane of the optical unit 14 in relation to the light propagation direction, whereas the fly's eye condenser 200 itself continues to be arranged in the front focal plane of the optical unit 14.

In the divergent illumination of the fly's eye condenser 200 depicted in FIG. 2, a super-position of the images from all field honeycombs 211, 212, 213 of the fly's eye condenser 200 is implemented by suitable configuration of the field honeycombs or pupil honeycombs in respect of the respective "pitch": in accordance with FIG. 2, this "pitch" is selected differently for the field honeycombs on the one hand and the pupil honeycombs on the other hand, with the "pitch" of the pupil honeycombs 221, 222, 223 being enlarged in relation to that of the field honeycombs 211, 212, 213 in the specific exemplary embodiment.

Figure 4:
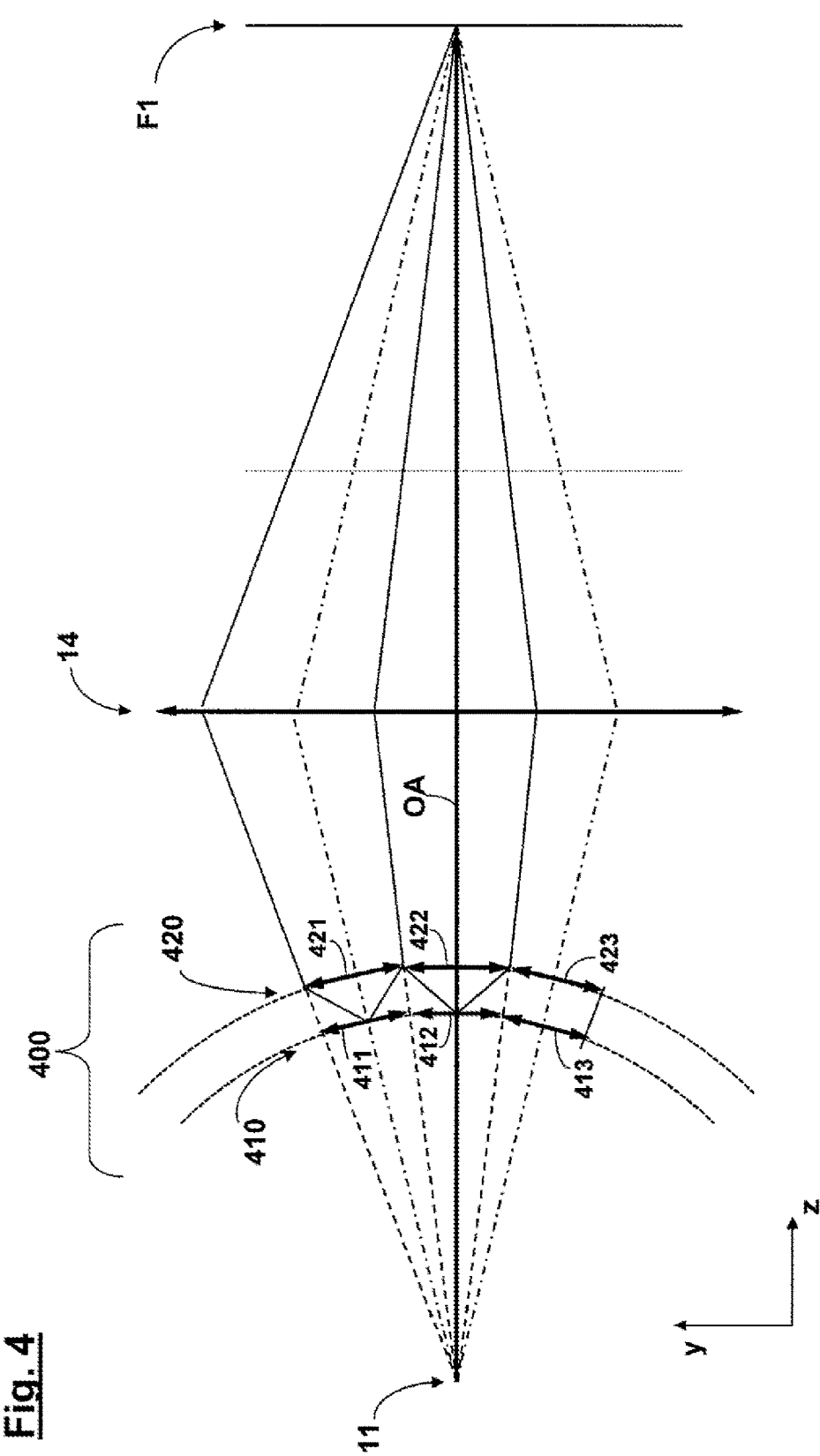
FIGS. 4-5 show schematic illustrations for explaining the arrangement of a fly's eye condenser in an illumination device in accordance with further embodiments of the invention.

FIG. 4 shows a schematic illustration for explaining the arrangement of a fly's eye condenser 400 in an illumination device in accordance with a further embodiment of the invention, wherein components analogous or substantially functionally identical to FIG. 2 are denoted by reference numerals increased by "200". In accordance with FIG. 4, all field honeycombs 411-413 and all pupil honeycombs 421-423 of the fly's eye condenser 400 are arranged tangentially on in each case one common circular segment such that the chief rays (once again plotted in a dash-dotted manner in each case) are each incident in a perpendicular manner on the respective field honeycombs 411-413 and pupil honeycombs 421-423 and accordingly pass through the relevant optical channel without deflection.

In particular, the configuration in accordance with FIG. 4 is advantageous to the extent that, for example in contrast to the design described above with reference to FIG. 2 (in which the chief rays incident on the individual field honeycombs or pupil honeycombs are already not incident in a perpendicular manner, but instead at a finite angle relative to the surface normal of the respective field honeycomb or pupil honeycomb), the maximum beam angles incident on each one of the field honeycombs or pupil honeycombs may be minimized and hence unwanted field variations of the intensity profile may be avoided and the capability of the optical system may be increased.

Figure 5:
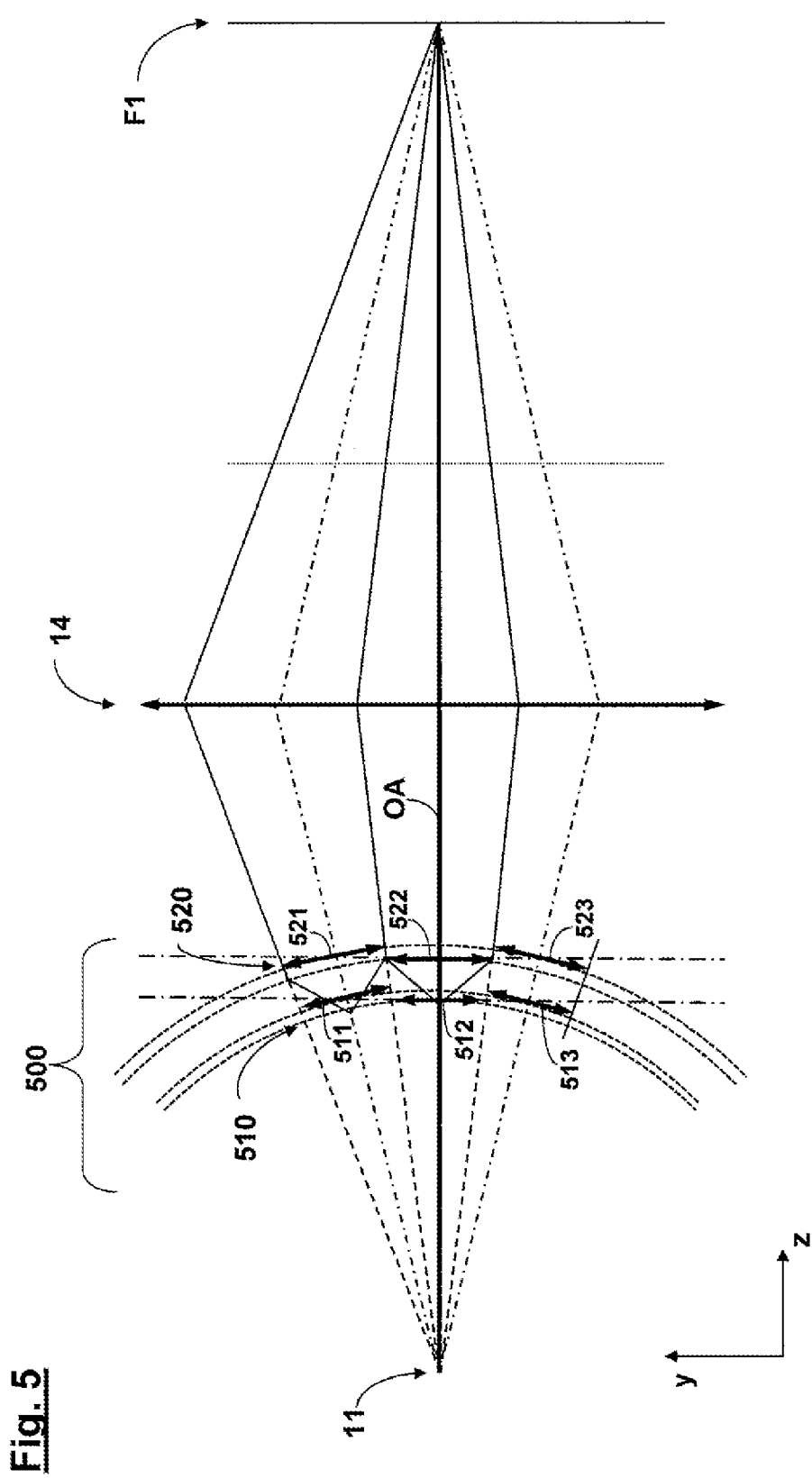

FIG. 5 shows a schematic illustration for explaining the arrangement of a fly's eye condenser 500 in an illumination device in accordance with a further embodiment of the invention, wherein components analogous or substantially functionally identical to FIG. 2 are, once again, denoted by reference numerals increased by "300". In accordance with FIG. 5, all field honeycombs 511-513 and all pupil honeycombs 521-523 of the fly's eye condenser 500 are arranged tangentially on one circular segment in each case such that the chief rays (in each case plotted in a dash-dotted manner) pass through the relevant optical channel without deflection, with all field honeycomb center points and pupil honeycomb center points respectively lying in a common plane (in each case extending perpendicular to the optical system axis OA). The stepped arrangement arising here may be advantageous from a manufacturing point of view compared to a configuration with curved planes in accordance with FIG. 4 since it is possible to avoid bending of the substrate carrying the field honeycombs 511-513 and of the substrate carrying the pupil honeycombs 521-523 and of the fly's eye condenser 500.

Even though the invention has been described on the basis of specific embodiments, numerous variations and alternative embodiments will be evident to the person skilled in the art from the disclosure given here, e.g. through combination and/or exchange of features of individual embodiments. Accordingly, for the person skilled in the art, such variations and alternative embodiments are concomitantly encompassed by the present invention, and the scope of the invention is restricted only within the meaning of the appended patent claims and the equivalents thereof.

What is claimed is:

1. An optical system of a microlithographic projection exposure apparatus designed for operating with light having a wavelength of at least 150 nm and propagating in a light propagation direction, comprising:
    an element producing an angular distribution for light incident during operation of the optical system; and
    a fly's eye condenser which comprises two arrangements, one following the other in the light propagation direction and comprising beam-deflecting optical elements arranged to produce a multiplicity of optical channels;
    wherein no optical element with refractive power is arranged in the beam path between the element producing the angular distribution and the fly's eye condenser, and
    wherein at least some of the beam-deflecting optical elements in both arrangements comprising the beam-deflecting optical elements are arranged tangentially on at least one circular segment.

2. The optical system as claimed in claim 1, wherein the two arrangements comprising the beam-deflecting optical elements one following the other in the light propagation direction have differing period lengths.

3. The optical system as claimed in claim 1, wherein at least some of the beam-deflecting optical elements in both arrangements made of beam-deflecting optical elements are arranged such that respective chief rays passing centrally through the respective beam-deflecting optical elements producing the optical channels during operation of the optical system are incident perpendicularly onto the respective beam-deflecting optical element.

4. The optical system as claimed in claim 1, wherein at least some of the beam-deflecting optical elements in both arrangements are arranged such that, for at least one of the two arrangements, respective center points of the beam-deflecting optical elements lie in a common plane extending perpendicular to the optical system axis.

5. The optical system as claimed in claim 1, wherein the fly's eye condenser is arranged such that, for at least some of the optical channels, respective chief rays passing centrally through the respective beam-deflecting optical elements producing the optical channels during operation of the optical system are divergent.

6. An optical system of a microlithographic projection exposure apparatus designed for operating with light having a wavelength of at least 150 nm and propagating in a light propagation direction, comprising:
    an element producing an angular distribution for light incident during operation of the optical system; and
    a fly's eye condenser which comprises two arrangements, one following the other in the light propagation direction and comprising beam-deflecting optical elements arranged to produce a multiplicity of optical channels;
    wherein the fly's eye condenser is arranged such that, for at least some of the optical channels, respective chief rays passing centrally through the respective beam-deflecting optical elements producing the optical channels during operation of the optical system are divergent.

7. The optical system as claimed in claim 6, with an optical system axis, wherein the fly's eye condenser is arranged such that a maximum angle from the optical system axis is at least 5 mrad for the respective chief rays passing centrally through the respective beam-deflecting optical elements during operation of the optical system.

8. The optical system as claimed in claim 6, wherein the element producing the angular distribution is a mirror arrangement with a plurality of mirror elements that are adjustable independently of one another.

9. The optical system as claimed in claim 6, wherein the element producing the angular distribution is a diffractive optical element.

10. The optical system as claimed in claim 6, wherein at least one of the beam-deflecting optical elements is a refractive lens element.

11. The optical system as claimed in claim 6, wherein the fly's eye condenser is arranged at least in direct vicinity of a pupil plane.

12. An illumination device of a microlithographic projection exposure apparatus, wherein the illumination device comprises:
    an optical system as claimed in claim 1; and
    at least one lens group following the optical system in the light propagation direction.

13. A microlithographic projection exposure apparatus comprising an illumination device and a projection lens, the illumination device illuminating an object plane of the projection lens during operation of the projection exposure apparatus and the projection lens imaging the object plane onto an image plane, wherein the illumination device comprises an optical system as claimed in claim 1.

14. A method for microlithographically producing microstructured components, comprising:
    providing a substrate, to which a layer composed of a light-sensitive material is at least partly applied;
    providing a mask comprising structures to be imaged;
    providing a microlithographic projection exposure apparatus as claimed in claim 13; and
    projecting at least one part of the mask onto a region of the layer with the projection exposure apparatus.

15. An optical system of a microlithographic projection exposure apparatus designed for operating with light having a wavelength of at least 150 nm and propagating in a light propagation direction, comprising:
    an element producing an angular distribution for light incident during operation of the optical system; and
    a fly's eye condenser which comprises two arrangements, one following the other in the light propagation direction and comprising beam-deflecting optical elements arranged to produce a multiplicity of optical channels;
    wherein no optical element with refractive power is arranged in the beam path between the element producing the angular distribution and the fly's eye condenser; and
    wherein the fly's eye condenser is arranged such that, for at least some of the optical channels, respective chief rays passing centrally through the respective beam-deflecting optical elements producing the optical channels during operation of the optical system are divergent.

* * * * *